United States Patent [19]

Conrad et al.

[11] Patent Number: 4,582,374

[45] Date of Patent: Apr. 15, 1986

[54] HIGH DENSITY INTERCONNECT SYSTEM

[75] Inventors: Jack S. Conrad; Richard F. Granitz; Joseph L. Lockard; William H. Rose, all of Harrisburg, Pa.

[73] Assignee: AMP Incorporated, Harrisburg, Pa.

[21] Appl. No.: 314,601

[22] Filed: Oct. 26, 1981

[51] Int. Cl.[4] .................... H05K 1/00

[52] U.S. Cl. .................... 339/17 M; 339/75 M; 339/255 R; 339/14 R

[58] Field of Search .................... 339/14 R, 17 R, 18, 339/75 R, 75 M, 74 R, 75 MP; 324/158 F, 158 P

[56] References Cited

U.S. PATENT DOCUMENTS

| | | | |
|---|---|---|---|
| 3,179,913 | 4/1965 | Mittler et al. | 339/18 R |
| 3,333,225 | 7/1967 | McNutt | 339/17 |
| 3,341,801 | 9/1967 | Brookman et al. | 339/18 B |
| 3,406,368 | 10/1968 | Curran | 339/17 R |
| 3,923,359 | 12/1975 | Newsam | 339/17 M |
| 3,927,925 | 12/1975 | Borsuk | 339/14 P |
| 4,134,631 | 1/1979 | Conrad et al. | 339/18 B |
| 4,161,655 | 7/1979 | Cotic et al. | 339/17 R |
| 4,329,005 | 5/1982 | Braginetz et al. | 339/18 B |
| 4,352,061 | 9/1982 | Matrone | 324/158 F |

*Primary Examiner*—Gil Weidenfeld

*Assistant Examiner*—David L. Pirlot

*Attorney, Agent, or Firm*—Adrian J. LaRue; Anton P. Ness

[57] ABSTRACT

A high density interconnect system is described which comprises a laminated board including a conductive power plane and a ground plane insulated from each other and containing a series of holes therethrough. Signal contacts, ground contacts, power contacts, data bus interconnect contacts, and feed-through contacts are selectively mounted in the series of holes with the ground contacts and power contacts connected to the respective ground plane and conductive power plane and the other contacts insulated therefrom. Front contact housings are secured against the laminated board means and contain spring-loaded contacts in openings therein for electrical engagement with the signal contacts and for electrical engagement with pins of a signature board. Rear contact housings house contact sections of the signal, power, ground, and data bus interconnect contacts to which input/output connectors of computer boards are connected for supplying power thereto, and operating signals from the computer boards are transmitted via the signal contacts to the signature board which conducts tests on the board under test to test the same. A cam-operative apparatus moves a platen carrying the signature board so that the pins of the signature board are moved into electrical engagement with the spring-loaded contacts.

16 Claims, 7 Drawing Figures

HIGH DENSITY INTERCONNECT SYSTEM

FIELD OF THE INVENTION

This invention relates to interconnect systems which provide power to the computer means that generates the test signals which are transmitted to a signature board to which is connected the board to be tested.

BACKGROUND OF THE INVENTION

Plugboards or interconnect systems as disclosed in U.S. Pat. Nos. 2,927,295 and 3,133,775 were used to internally program computer functions and, in test equipment, were used to create input/output interfaces. The plugboard programming system and front panel interconnect provided infinite switching combinations through use of permanently-wired rear boards and selectively-programmed front boards.

The present problem is that logic systems have shrunk to typically 0.100 inch centerlines, whereas plugboards have been limited to 0.250 or 0.375 inch contact centers. Using these plugboards in the current 0.100 inch centerline logic systems has meant that interconnects must be hand-wired thereby resulting in a complicated wiring maze and signal degradation due to varying impedances, crosstalk, and excessive lead lengths. Also, in the old plugboard interface, separate power and ground input/output were relied upon.

These factors, combined with the unwieldy size of plugboards and their vulnerable exposed contacts required a new kind of plugboard system in order to accommodate the new generation of automatic test equipment that has been developed.

According to the present invention, a high density interconnect system comprises a laminated interface board including a power plane and a ground plane insulated from each other and through which a series of holes extend, preferably at a spacing of 0.100 inches. Signal contacts, ground contacts, power contacts, data bus interconnect contacts, and feed-through contacts are selectively mounted in the series of holes with the ground contacts and power contacts connected to the respective ground and power planes while the other contacts are insulated therefrom. Front contact housings are secured against the laminated interface board and contain spring-loaded contacts in openings therein for electrical engagement with the signal contacts and for electrical engagement with pins of a signature board. Rear contact housings house contact sections of the signal, power, ground, and data bus interconnect contacts to which input/output connectors of computer boards are connected for supplying power thereto and operating signals are supplied by the computer boards to the signature board which conducts tests on the board under test to test same. A cam-operating apparatus moves a platen carrying the signature board so that the pins of the signature board are moved into electrical engagement with the spring-loaded contacts.

DETAILED DESCRIPTION OF THE PREFERRED EMBODIMENT

Figure 1:
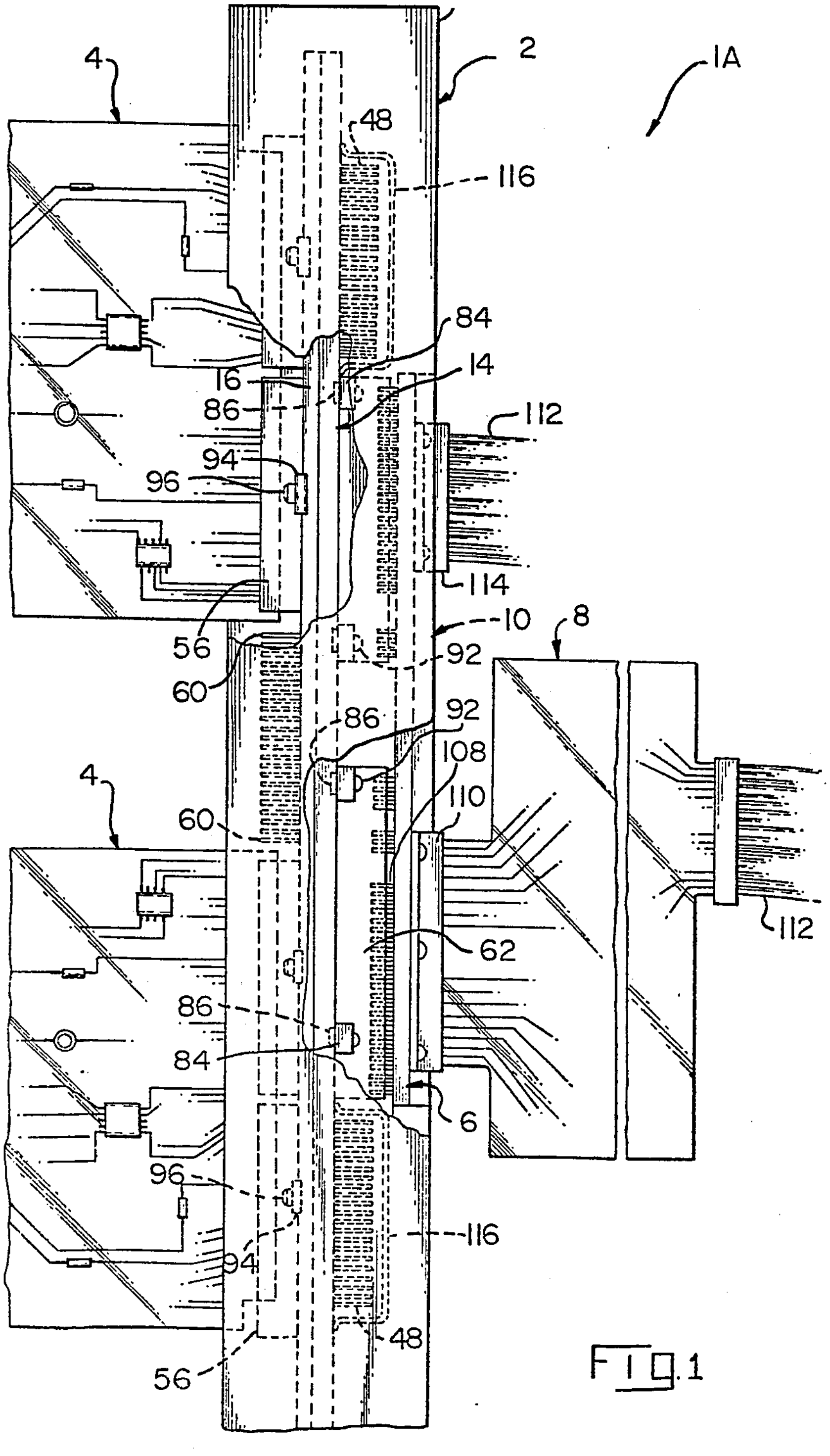
FIG. 1 is a side elevational view with parts broken away showing an interconnect system.

FIG. 1 illustrates a system for testing boards that includes an interconnect apparatus IA, including an interconnect device 2 to which are connected computer boards 4 that provide a multi-function program. A signature board 6 is to be connected to computer boards 4 via interconnect device 2 and is provided with a specific program for conducting a specific test to test a unit under test which comprises a specific board to be tested. A platen 10 is used to mount signature board 6 thereon so as to connect signature board 6 to interconnect device 2 as hereinafter described.

Figure 2:
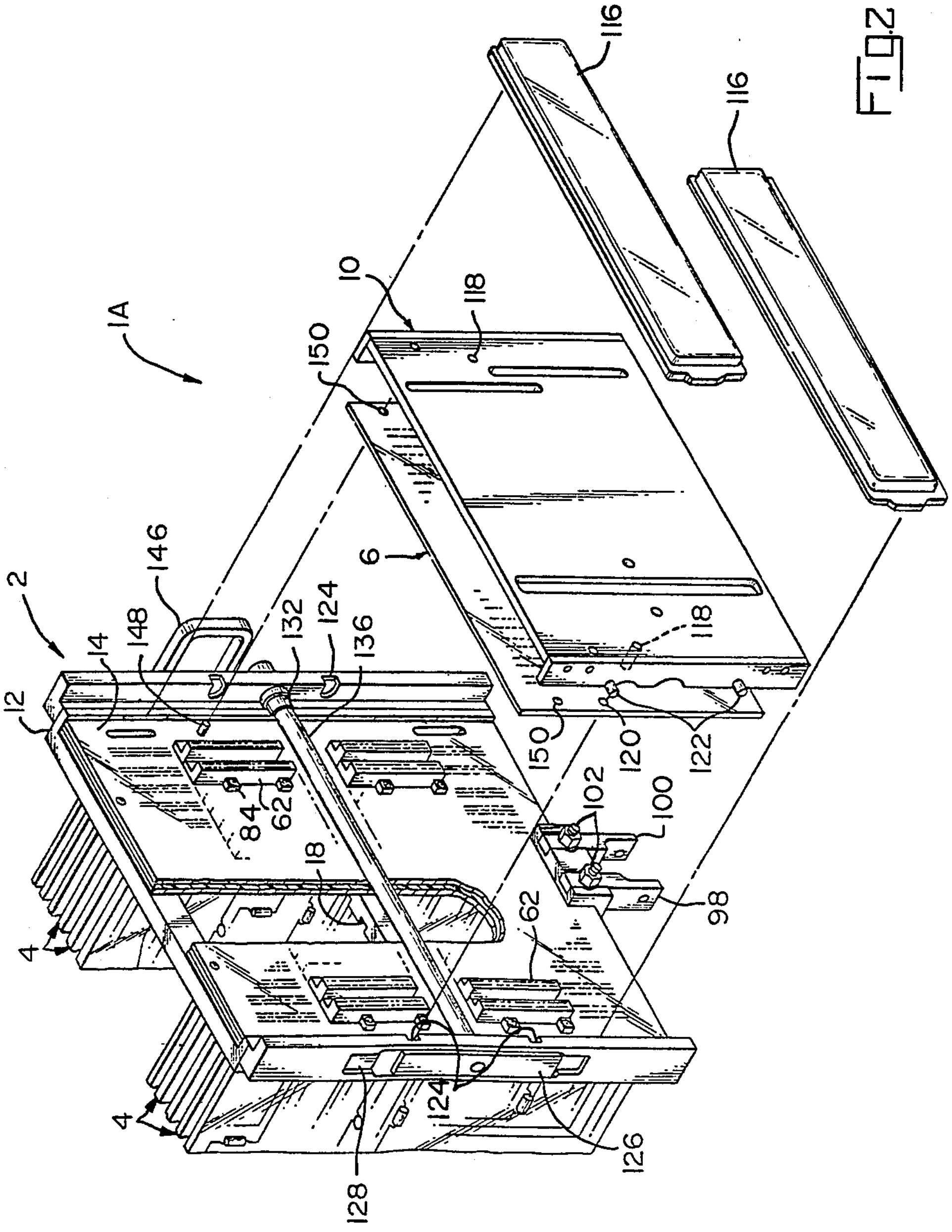
FIG. 2 is an exploded perspective view of FIG. 1.
Figure 3:
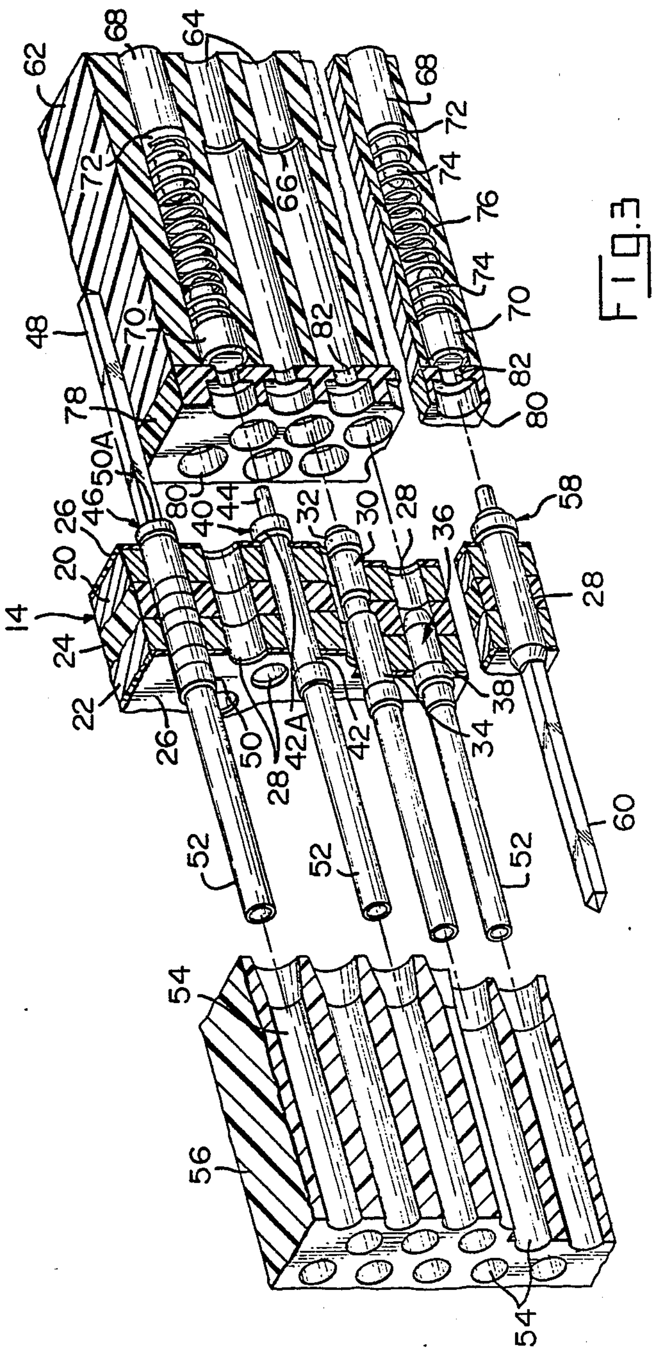
FIG. 3 is an exploded view partly in section showing details of the interconnect apparatus.
Figure 4:
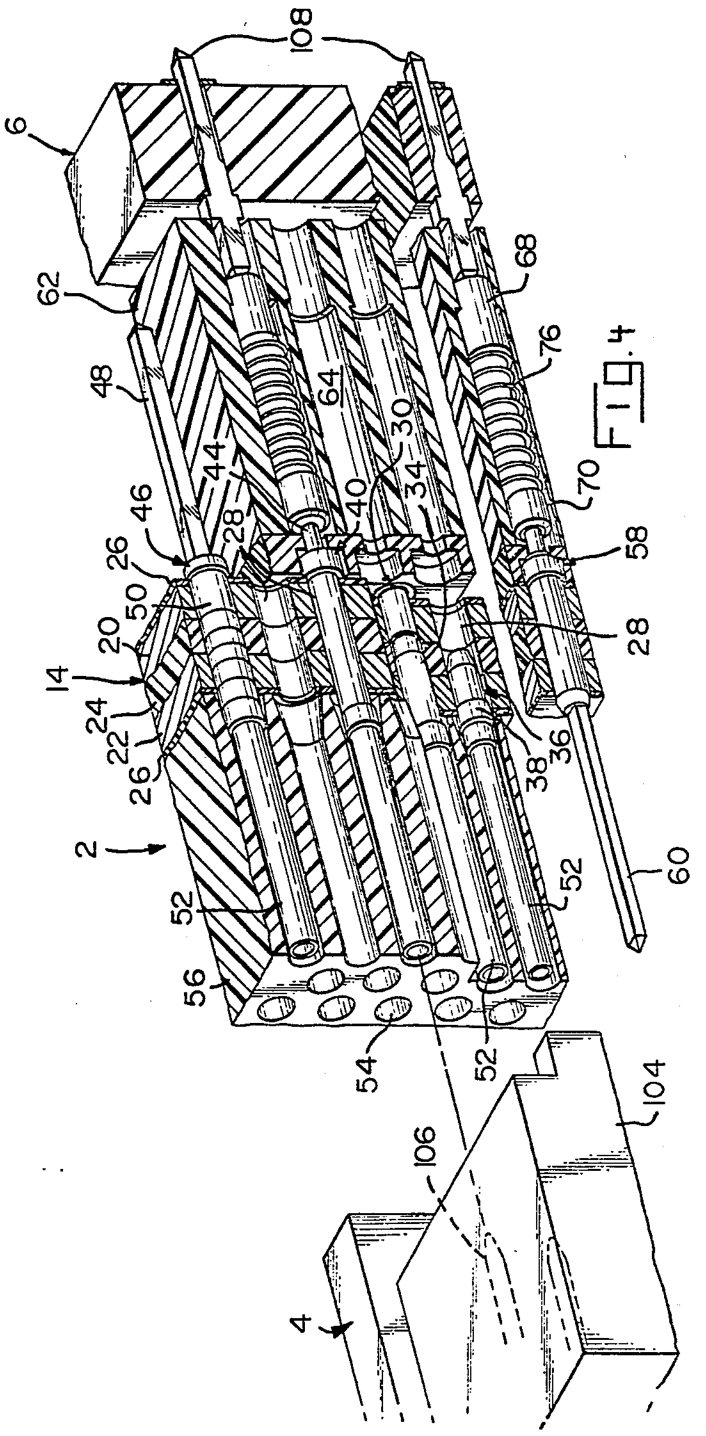
FIG. 4 is a view similar to FIG. 3 showing the parts assembled except for a computer board which is exploded therefrom.

FIGS. 2 through 4 illustrate the interconnect device 2 in greater detail. A frame 12 has a laminated board 14 mounted thereon. Bars 16 are mounted in slots 18 located in frame 12. Laminated board 14 comprises a metal ground plane 20, a metal power plane 22, and a dielectric 24 therebetween to insulate ground plane 20 from power plane 22. A coating of insulation 26 is provided on the outside surfaces of power plane 20 and ground plane 22. A series of holes 28 are located in laminated board 14 and they are preferably spaced at 0.100 inch centerline spacings which enables the disposition of contacts in a manner to provide a high density interconnect system to accommodate current automatic test systems.

A series of electrical contacts are located in openings 28 and they are selectively located therein. Ground contacts 30 have a knurled section that frictionally and electrically engages with ground plane 20 and an annular shoulder 32 to limit inner movement of ground contact 30 within laminated board 14. Insulation sleeve 34 is located on ground contact 30 to insulate it from power plane 22.

Power contacts 36 have a knurled section that frictionally and electrically engage power plane 22 and they have an annular shoulder 38 to limit their inner movement within laminated board 14. Signal contacts 40 are similar to ground contacts 30 except they have an insulation sleeve 42 to frictionally retain them within holes 28 and to insulate them from ground plane 20 and power plane 22. Signal contacts 40 also contain a pin 44 extending outwardly therefrom.

Data bus interconnect contacts 46 are similar to signal contacts 40 except they have a wire-wrapped post 48 extending outwardly therefrom. A grooved insulation sleeve 50 is secured onto contact 46 to frictionally maintain it in position in laminated board 14 and it includes an annular shoulder 50A to limit movement of contacts 46 within board 14. Each of contacts 30, 36, 40, and 46 have socket sections 52 extending outwardly therefrom which are located in openings 54 of rear connector housings 56 which are secured between bars 16.

Calibration or feed through-signal contacts 58 are disposed in openings 28 in laminated board 14 and they are identical to signal contacts 40 except they are provided with a post section 60 instead of a socket section 52.

A front connector housing 62 contains openings 64 extending therethrough, each opening 64 having larger and smaller diameter sections separated by an internal shoulder 66. Contact members 68, 70 are located in openings 64 with contact member 68 being disposed in the smaller diameter section of opening 64 and being provided with an annular shoulder 72 for engagement with internal shoulder 66 to maintain it within opening 64. Contact member 70 is located in the larger diameter section of opening 64. Each of contact members 68, 70 is provided with a projection 74 onto which a spring member 76 is disposed to enable spring contact members 68, 70 to move respectively within openings 64. A retaining member 78 is located on housing 62 to retain spring-biased contact members 68, 70 within their respective openings. Bores 80 are located in retaining member 78 coincident with openings 64 to enable the annular shoulders of contacts 32, 40 and 58 to be disposed therewithin. Bores 80 communicate with holes 82 to enable the pins 44 of contacts 42 and 58 to electrically engage contact members 70 and to receive annular shoulders of contacts 30 therein.

Figure 5:
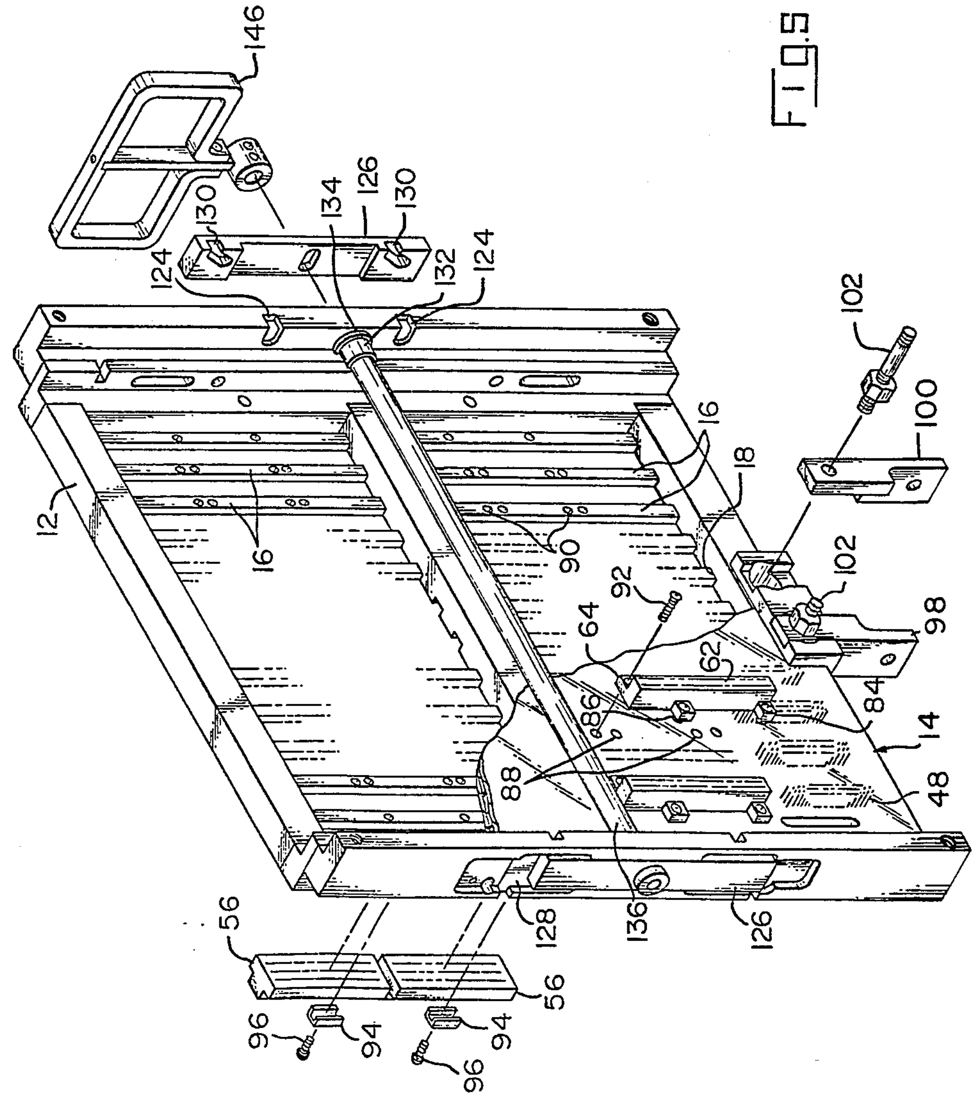
FIG. 5 is a perspective view with parts exploded showing the actuating mechanism.
Figure 7:
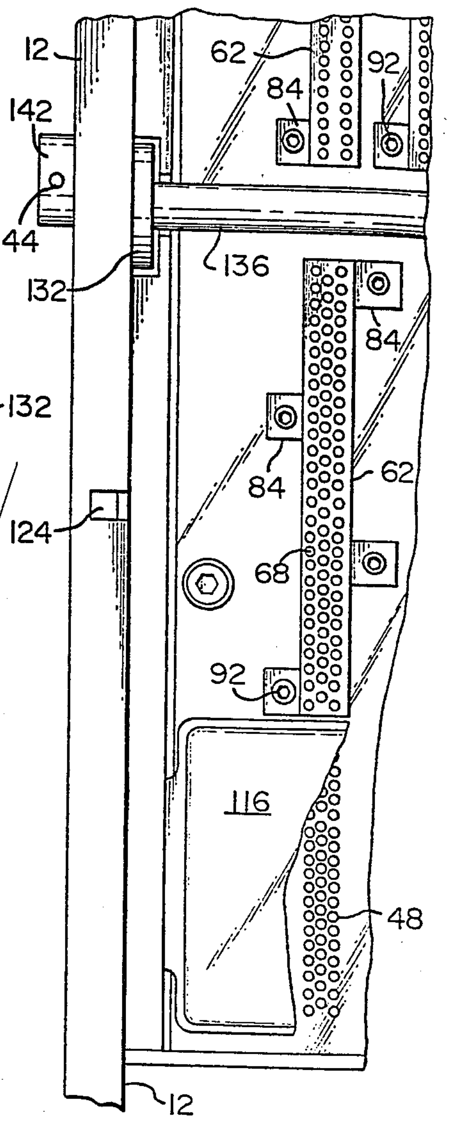
FIG. 7 is part front elevational view of the interconnect device.

Front connector housings 62 are provided with mounting projections 84 as shown in FIGS. 5 and 7 which are provided with annular projections 86 that extend through holes 88 in laminated board 14 which are coincident with threaded holes 90 in bars 16 to mount connector housings 62 in position via screws 92 with annular projections 86 preventing the screws 92 from shorting ground plane 20 and power plane 22. Rear connector housings 56 are positioned between bars 16 and U-shaped clips 94 are secured onto bars 16 via screws 96 to secure connector housings 56 in position in coincidence with respective housings 62. Terminals 98, 100 are electrically connected to ground plane 20 and power plane 22 respectively via bolts 102 in a manner so as not to short the power plane and ground plane together. With this arrangement, power is available at the levels of voltage and amperage necessary to operate the system.

Computer boards 4 are each provided with an electrical connector 104 which enables the pins 106 thereof to electrically connect with socket sections 52 of connector housings 56.

The circuits located on boards 4 form a computer containing the conventional ROMS, RAMS, logic circuits, microprocessor and the like to conduct test programs under control of a conventional keyboard and display (not illustrated). The power to operate the circuits on boards 4 is supplied from ground and power contacts 30 and 36 electrically connected respectively to ground plane 20 and power plane 22 of interconnect apparatus IA and the test signals generated by the test programs of the computer are transmitted via signal contacts 40, spring contacts 68, 70 of interconnect apparatus IA and pins 108 to the electronic circuits on signature board 6 which conduct a specific test program to test unit under test. Indicating means (not shown) are provided to indicate the results of the test as to whether the test unit is acceptable.

The test unit can also have connected thereto a tape cable 112 or the like which is also connected to signature board 6 via electrical connector 114 for more extensive testing.

If the program established by computer boards 4 needs to be changed, this can be done by use of wire posts 48 by interconnection of circuits on computer boards 4 or by addition of additional circuitry by connection with posts 48. Posts 60 are used to supply calibration or other signals to signature board 6 and then for use by the unit under test.

Plastic covers 116 are snappably secured onto laminated board 14 to cover the data bus interconnect contacts 46 located above and below front connector housings 62 to prevent them from being exposed.

Figure 6:
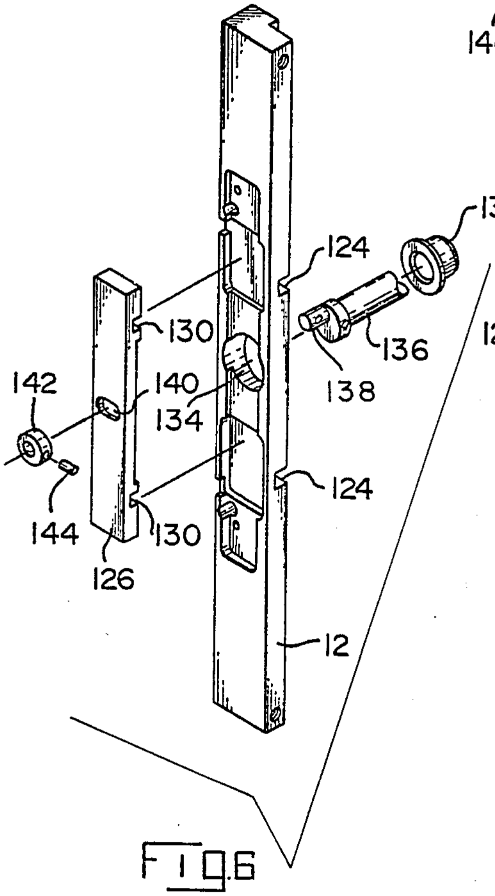
FIG. 6 is an exploded perspective view showing details of the actuating mechanism.

FIGS. 5 through 7 illustrate an actuating mechanism to move pins 108 on board 6 into electrical engagement with spring-biased contacts 68.

Platen 10 is provided with pins 118 which mate with movable grommets 120 mounted in signature board 6 to thereby carry such board. Platen 10 is also provided with spaced pins 122 along each side which mate with horizontal slots 124 in frame 12. Slidable members 126 are located in channels 128 in the sides of frame 12 and they are provided with slanted slots 130 that communicate with slots 124. Bushings 132 are located in holes 134 in the sides of frame 12 containing channels 128 and the shaft 136 is rotatably disposed therein. Eccentric members 138 extend outwardly from each end of shaft 136 and are disposed in an oblong slot 140 in slidable members 126. A collar 142 is secured on one eccentric member 138 via a pin 144 and an operating handle 146 is pinned onto the other eccentric member 138 to secure shaft 126 in position.

To connect pins 108 of board 6 to respective spring-biased contact members 68 in housings 62, board 6 is mounted on pins 118 of platen 10 via movable grommets 120. Pins 122 of platen 10 are disposed in slots 124 of frame 12, with pins 148 on laminated board 14 engaging with bushings 150 in board 6 to properly align pins 108 with the respective openings 64 in connector housings 62. Now that pins 122 of platen are disposed in slots 124 of frame 12 so that slanted slots 130 of slidable members 126 are in communication with slots 124, handle 146 is moved from its non-operated position to its operated position whereby eccentric member 138 move in oblong slots 140 of slidable members 126, thereby causing slidable members 126 to move in channels 128, causing slanted slots 130 to move pins 122 along slots 124. This causes platen 10 to move inwardly along slots 124 and also moves board 6 inwardly so that contacts 108 are moved into electrical engagement with spring-biased contact members 68 to make electrical contact therewith. Reverse operation of handle 146 moves platen 10 and board 6 outwardly along slots 124 to disconnect pins 108 from spring-biased contact members 68.

The use of this operating mechanism enables the large number of pins 108 of board 6 to be electrically engaged with contact members 68 because of the ability of the frame and platen to align the contact members 68 and the pins 108. The use of spring-biased contact members 68 substantially reduces the forces of engagement therebetween.

A unique feature of this interconnection system is that it offers complete pluggability of the computer boards to enable replacement for servicing or change of programs. Interboard wiring is accomplished via data bus interconnect contacts 46 which allows easy access for circuit rewiring and avoids the need to open up the automatic test equipment for each alteration.

The interconnect device IA, while supplying power and ground to the computer boards, can also supply the same to the signature board if desired, via contacts 30 and 36 being provided with pins to electrically engage contact members 70 of the spring-biased contact members. Interconnect device IA also acts as a physical support for the contacts 30, 36, 40, 46 and 58, and connects the test computer to the item being tested.

The interconnect system features an active connection area in which the signal contacts are spring loaded. This allows the contacts to compress when a signature board 6 is connected to the interconnect device 2, thereby eliminating the need for the side-to-side contact movement associated with plugboards and offering complete contact protection against damage. The spring-biased contact members provide reliable contact pressure when connected with the pins of the signature board.

The signature board concept allows the user to prepare and provide its own programming into the universal test computer via the interconnect system. Rather than having to open up the computer to do rewiring for a particular test, the test is programmed via the signature board. Thus, a library of such programmed signature boards can be established to service a range of electronic systems.

Units under test are also connected directly to the interconnect device which improves electrical performance and reducing fixturing and harness costs.

Through use of this interconnect system, patchcords and discrete wire have been eliminated, impedance is fixed, electrical paths are shortened, and signal crosstalk is substantially reduced. Programming has been made flexible; all interconnects are on one plane; and programming access, and board removal and replacement have been simplified. Any change in the data bus can be effected by rewiring from the front of the system. Maintenance is advantageous because computer boards can be easily plugged into the rear of the interconnect device and signature boards inserted into the front of such device. The interconnect device can now take the physical wear and tear of physical plugging and removal without exposed contacts to be endangered.

We claim:

1. An interconnection system of the type comprising a frame member having a board member mounted thereon, contact members on the board member for connection with other contact members of other board members to interconnect the board members together, said interconnection system being characterized in that:

said board member defining a laminated member having a power plane and a ground plane separated from each other by a dielectric member, said laminated member having a series of holes extending therethrough and said power plane and ground plane adapted to be connected respectively to power and ground terminals;

signal, power, and ground contact members disposed in selected ones of said series of holes with said power and ground contact members being electrically connected to said power and ground planes respectively and said signal contact members being insulated from said power and ground planes;

said signal, power, and ground contact members, adapted to be connected to respective signal, power and ground contact members of electrical connector members of the other board members to supply power thereto from the power and ground contact members and the other board members supplying operating signals via said signal contact members;

electrical connectors having electrical contacts therein secured to said laminated member with said electrical contacts being electrically connected with said signal contact members and with contact elements of another of the other board members whereby the operating signals from the other board members are supplied via said signal contact members to the signal contact elements and the circuits of the another of the other board members to operate such circuits.

2. An interconnection system as set forth in claim 1, wherein said signal, power, and ground contact members have socket members for connection with the electrical connector members.

3. An interconnection system as set forth in claim 1, wherein said electrical contacts define spring-loaded contacts.

4. An interconnection system as set forth in claim 1, wherein data bus interconnect contact members are disposed in said series of holes insulated from said power and ground planes and including sections to enable rewiring of the other board members so that changes can be made to the operating signals being supplied by the other board members.

5. An interconnection system as set forth in claim 1, wherein feed-through contact members are disposed in said series of holes insulated from said power and ground planes and including sections to supply other operating signals to the another of the other board members.

6. An interconnection system as set forth in claim 1, wherein a platen carries the another of the other board members, pins on said platen mate with slots in said frame, an actuating mechanism on said frame engages said pins and moves said pins, another board member, and platen along the slots thereby causing the contact elements to be electrically connected to said electrical contacts.

7. An interconnection system as set forth in claim 6, wherein said actuating mechanism includes slidable members slidably mounted on said frame member and including slanted slots therein communicating with said frame member slots, a shaft member mounted in said frame member including eccentrics engaging said slidable members, and a handle secured to said shaft member to rotate the same thereby causing said slidable members to slide along said frame member.

8. An interconnection system as set forth in claim 6, wherein pin members extend outwardly from said laminated member to mate with holes of the another board member and pin elements extend outwardly from said platen to mate with other holes in the another board member.

9. An interconnect apparatus for interconnecting board means of a computer that generates general test programs with a signature board means that generates a specific test program under control of the computer for testing units under test that are to be connected to the signature board means, said interconnect apparatus comprising:

laminated board means including ground plane means and power plane means spaced from each other by dielectric means, said laminated board means having a series of holes extending therethrough;

power, ground, and signal contact means disposed in said series of openings with said power contact means and said ground contact means being electrically connected respectively to said power plane means and said ground plane means and said signal contact means insulated from said power plane means and said ground plane means, said power, ground, and signal contact means adapted to be connected to input/output connector means of the computer board means to supply power thereto via said power and ground contact means and to transmit operating signals therefrom via said signal contact means;

contact housing means secured to said laminated board means having contact member means therein in alignment with respective holes in said laminated board means, said contact member means being electrically connected with respective signal contact means and with contact elements of the signature board means which receives the operating signals from the computer board means; and board-carrying means for carrying the signature board means and for moving the contact elements thereof into electrical engagement with said contact member means.

10. An interconnect apparatus as set forth in claim 9 and further comprising data bus interconnect contact means disposed in said series of holes and being insulated from said power and ground plane means, said data bus interconnect contact means being connectable to the computer board means via the input/output connector means and having post means to enable circuits of the computer board means to be interconnected or to have other circuitry connected thereto so that changes can be made to the operating signals being supplied by the computer board means.

11. An interconnect apparatus as set forth in claim 9 and further comprising feed-through contact means disposed in said series of holes and being insulated from said power and ground plane means, said feed-through contact means being connectable to said contact member means to supply other operating signals to the signature board means.

12. An interconnect apparatus as set forth in claim 9 wherein said contact member means comprise spring-biased contact members.

13. An interconnect apparatus as set forth in claim 9 wherein said board-carrying means comprises a platen having mounting means onto which the signature board means is mounted.

14. An interconnect apparatus as set forth in claim 13 wherein said laminated board means comprises alignment means mating with the signature board means to align the contact elements thereof with said contact member means.

15. An interconnect apparatus as set forth in claim 13 wherein said board-carrying means comprises actuating means for moving said platen and signature board means carried thereby so that the contact elements are electrically engaged with said contact member means.

16. An interconnect apparatus as set forth in claim 15 wherein said actuating means comprises frame means on which said laminated board means is mounted, said frame means having horizontal slot means therein, eccentric means movably mounted on said frame means, slidable members slidably mounted on said frame means having slanted slot means in communication with said horizontal slot means and being operatively connected to said eccentric means, pin segments provided on said platen and being disposable in said horizontal slot means, and handle means connected to said eccentric means whereby upon operation of said handle means, said eccentric means slidably moves said slidable members thereby causing said slanted slot means to move said pin segments along said horizontal slot means so that the contact elements of the signature board means move into electrical engagement with said contact member means.

* * * * *